United States Patent [19]

Yamamoto et al.

[11] Patent Number: 4,824,760
[45] Date of Patent: Apr. 25, 1989

[54] LITHOGRAPHIC PRINTING PLATE WITH BENZOTRIAZOLES IMPROVED IN PRINTING ENDURANCE

[75] Inventors: Kazuyoshi Yamamoto; Masahiko Saikawa; Eiji Kanada, all of Nagaokakyo, Japan

[73] Assignee: Mitsubishi Paper Mills, Ltd., Tokyo, Japan

[21] Appl. No.: 35,368

[22] Filed: Apr. 7, 1987

[30] Foreign Application Priority Data

Apr. 11, 1986 [JP] Japan .................................. 61-83875

[51] Int. Cl.$^4$ ........................... G03C 5/54; G03F 7/06
[52] U.S. Cl. ..................................... 430/204; 430/229; 430/230; 430/233; 430/251; 430/302
[58] Field of Search ............... 430/204, 229, 227, 230, 430/251, 302, 233

[56] References Cited

U.S. PATENT DOCUMENTS

| | | | |
|---|---|---|---|
| 3,721,559 | 3/1973 | De Haes et al. ..................... | 430/204 |
| 3,776,728 | 12/1973 | Suzuki et al. ....................... | 430/204 |
| 4,160,670 | 7/1979 | Tsubai et al. ...................... | 430/204 |
| 4,361,635 | 11/1982 | Kinderman et al. ................ | 430/204 |
| 4,362,811 | 12/1982 | Iguchi et al. ....................... | 430/204 |
| 4,649,096 | 3/1987 | Tsubai et al. ....................... | 430/251 |

FOREIGN PATENT DOCUMENTS

| | | |
|---|---|---|
| 47-26201 | 10/1972 | Japan . |
| 48-5503 | 1/1973 | Japan . |
| 48-100203 | 3/1973 | Japan . |
| 48-29723 | 9/1973 | Japan . |
| 49-16507 | 7/1974 | Japan . |
| 53-21602 | 2/1978 | Japan . |
| 58-21250 | 2/1983 | Japan . |
| 60-113238 | 6/1985 | Japan . |

OTHER PUBLICATIONS

English Summary of Japanese Kokai No. 21250/83.
English Summary of Japanese Kokai No. 5503/73.
English Summary of Japanese No. 100203/73.
Japanese Kokai No. 16507/74, English Summary of.
Japanese Patent Examined Application No. 29/23/73, English Summary of.
English Summary of Japanese Kokai No. 113238/85.

Primary Examiner—Richard L. Schilling
Attorney, Agent, or Firm—Cushman, Darby & Cushman

[57] ABSTRACT

A lithographic printing plate made by silver complex diffusion transfer process from a lithographic printing plate material which contains a compound represented by the general formula [I] in photographic constituting layer is markedly improved in its printing endurance:

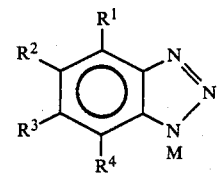

wherein M represents hydrogen, an alkali metal or ammonium ion and $R^1$-$R^4$ each represents hydrogen atom, alkyl group, alkenyl group, aralkyl group, aryl group, halogen atom, alkoxy group, hydroxyl group, amino group, carboxyl group, sulfone group, alkoxycarbonyl group, acylamide group or sulfonamide group and two of $R^1$-$R^4$ may jointly form a ring.

7 Claims, No Drawings

LITHOGRAPHIC PRINTING PLATE WITH BENZOTRIAZOLES IMPROVED IN PRINTING ENDURANCE

BACKGROUND OF THE INVENTION

This invention relates to a lithographic printing plate material which utilizes the silver complex diffusion transfer process.

The lithographic printing plate consists of greasy ink receptive oleophilic image portions and ink repellent oleophobic non-image portions, the latter being generally water receptive hydrophilic areas. Therefore, the customary lithographic printing is carried out by feeding both water and colored ink to the printing plate surface to allow the image portions to receive preferentially the colored ink and the non-image portions preferentially water and then transferring the ink deposited on image portions onto a substrate such as paper. In order to obtain a print of good quality, therefore, it is necessary that oleophilicity of the image portions and hydrophilicity of the non-image portions are both strong enough so that when water and ink are applied, the image portions may receive sufficient amount of ink while the non-image portions may completely repel the ink.

In the case of lithographic printing plate material which utilizes the silver complex diffusion transfer process for making the printing plate, especially the material having a nuclei layer on an emulsion layer, the silver salt grains where latent images have been formed by exposure bring about chemical development by development to change into black silver to form hydrophilic non-image portions and on the other hand, unexposed silver salt grains become silver salt complexes by the action of silver halide complexing agent contained in developer and diffuses into the surface nuclei layer, where the diffused silver salt complexes undergo physical development due to the presence of the nuclei to form image portions mainly composed of ink receptive silver.

In thus obtained lithographic printing plate, the silver layer precipitated on gelatin is utilized as ink receptive image portions and so resistance of the image portions against mechanical wearing is not sufficient as compared with the general lithographic printing plates such as PS plate and the like, resulting in the defects such as wearing-off of image portions and gradual decrease of ink-receptivity of image portions.

When hardness of gelatin is increased or amount of the physical development nuclei is increased in order to remove these defects, there occurs scumming to greatly reduce the printing endurance of lithographic printing plate. Generally, mechanical strength of image portions and scumming interfere with each other to give limitation to printing endurance of the lithographic printing plate and new technique to overcome this limitation has been much demanded.

As a result of the inventors' intensive researches in an attempt to improve printing endurance of the lithographic printing plate from the point of balancing between physical development and chemical development, it has surprisingly been found that the mechanical strength of image portions can be markedly increased without increase of scumming by containing a benzotriazole or its derivatives in a constitutional layer of the lithographic printing plate material and this invention has been accomplished.

SUMMARY OF THE INVENTION

The object of this invention is to provide a lithographic printing plate material which utilizes the silver complex diffusion transfer process for making the printing plate which is markedly improved in printing endurance.

DESCRIPTION OF THE INVENTION

The above object has been accomplished by providing a lithographic printing plate material which utilizes the silver complex diffusion transfer process and which comprises a support and at least an undercoat layer, a silver halide emulsion layer and a catalytic layer containing physical development nuclei provided on said support in this order, wherein at least one of these layers contains at least one of benzotriazoles and its derivatives thereof represented by the following general formula [I]:

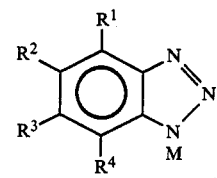

wherein M represents hydrogen, an alkali metal or an ammonium ion and $R^1$-$R^4$ each represents hydrogen atom, alkyl group, alkenyl group, aralkyl group, aryl group, halogen atom, alkoxy group, hydroxyl group, amino group, carboxyl group, sulfone group, alkoxycarbonyl group, acylamide group or sulfonamide group and $R^1$-$R^4$ may form a ring together. Preferably, $R^1$-$R^4$ are hydrogen, lower alkyl group, lower alkoxy group, halogen atom or sulfonamide group.

Typical examples of the benzotriazole substitution derivatives used in this invention are shown below, but this invention is not limited to use of these exemplified compounds.

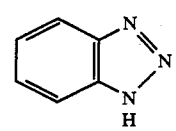

1

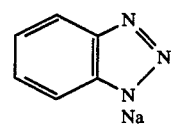

2

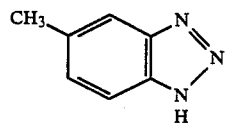

3

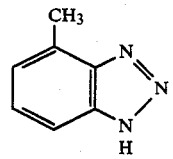

4

-continued
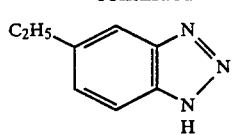 5
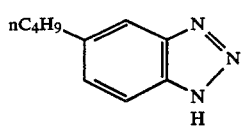 6
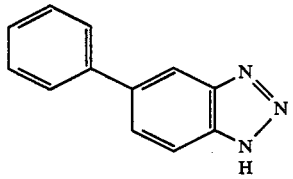 7
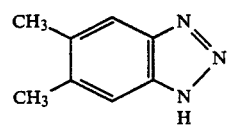 8
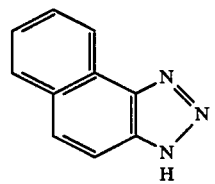 9
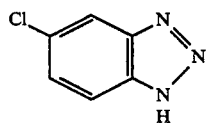 10
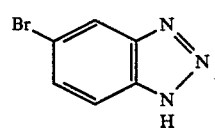 11
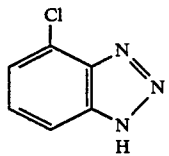 12
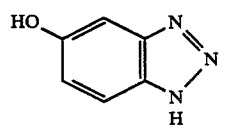 13
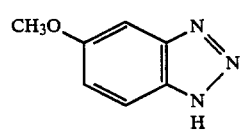 14
-continued
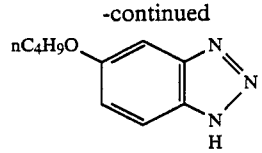 15
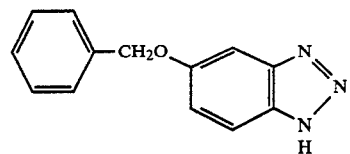 16
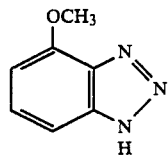 17
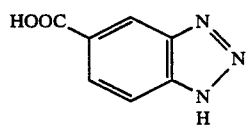 18
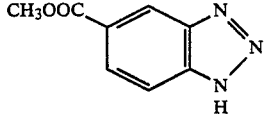 19
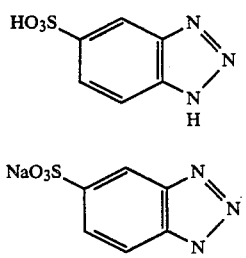 20
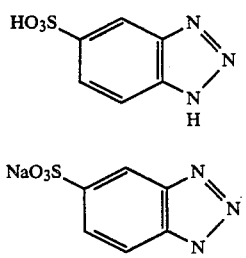 21
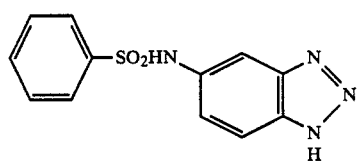 22
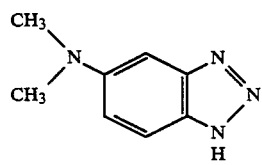 23
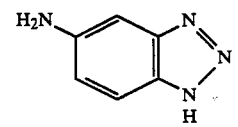 24
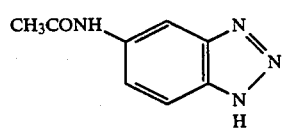 25

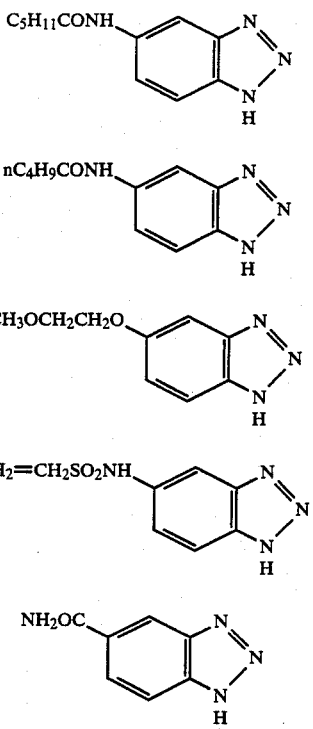

U.S. Pat. No. 4,361,635 and Japanese Patent Unexamined Publication No. 21250/83 suggest that addition of benzotriazole to a developer in production of lithographic printing plate materials increases developing speed. However, they make no mention of improvement of printing endurance and according to the present inventors' investigation, there were obtained no such remarkable effects as in this invention. Furthermore, Japanese Patent Unexamined Publication No. 113238/85 discloses a method of carrying out silver complex diffusion transfer treatment in the presence of said compounds or those similar to them in order to obtain images of high density and high contrast. However, the method for formation of images of high density, good color tone and high contrast has no relation with printing endurance of lithographic printing plates. That is, the printing endurance is mechanical strength of imaged silver against friction and is utterly different from color tone, density and contrast.

The compound used in this invention may be contained in any of the constituting layers of the photographic printing plate materials, but it is preferred for attaining remarkable improvement in printing endurance to contain it in a layer other than the emusion layer, for example, in the undercoat layer. The compound does not exhibit so great an effect as when it is added to a processing solution this indicates that it is important that the compound must be added at a severely selected point during the development course comprising chemical development, diffusion of silver salt complexes and physical development so that the effect can be exhibited.

The mechanism of action of the compound is not clear, but it seems that the compound has the effect of inhibiting the physical development and affects size and shape of the precipitated silver during the growth of physically developed silver, contributing to the improvement of printing endurance.

The amount of the compound to be used depends on the kind of the compound, but preferably is 1–200 mg/m$^2$ and more preferably 3–50 mg/m$^2$.

The compound may be contained in the constituting layers by any methods. It may be contained at the preparation of coating solution, just before coating or in-line with coating of the coating solution. There is also no special limitation in the method for coating of the constituting layers. There may be employed any of simultaneous coating of multi layers, single layer coating or combination of them. Preferred is to coat simultaneously the undercoat layer and the emulsion layer and coat the catalytic layer separately and singly.

The compound may be contained in combination with some of compounds containing mercapto group or thione group such as 1-phenyl-5-mercaptotetrazole.

Further, the compound may be contained in the constituting layers in combination with some of nitrogen-containing heterocyclic compounds containing neither mercapto group nor thione group such as tetraazaindenes together with compounds having mercapto group or thione group.

In the lithographic printing plate material of this invention, the gelatin-containing layer may be the undercoat layer, the emulsion layer or the catalytic layer. These gelatin-containing layers are generally hardened by gelatin hardeners. As examples of the gelatin hardeners, mention may be made of inorganic compounds such as chrom alum, aldehydes such as formalin, glyoxal, malealdehyde and glutaraldehyde, N-methylol compounds such as urea and ethylene ureas, aldehyde analogues such as mucochloric acid and 2,3-dihydroxy-1,4-dioxane, nitrogen-containing 6-membered compounds having active halogen such as 2,4-dichloro-6-hydroxy-S-triazine salts and 2,4-dihydroxy-6-chloro-S-triazine salts, compounds having active vinyl group such as divinyl sulfone, divinyl ketone and MMM-tri-acryloylhexanhydrotriazine, compounds having in one molecule at least two of ethyleneimino groups and epoxy groups which are active 3-membered rings, dialdehyde starch as a polymeric hardeners, etc. These hardeners may be used alone or in combination of two or more.

The hardeners may be added to all of the layers or some of them or only one layer. Of course, diffusible hardener may be added to either one of two layers when the two layers are simultaneously coated. The hardener may be added at the time of preparation of emulsion or in-line with coating of the layers.

The gelatin in the gelatin-containing layers may be partially substituted with one or more of hydrophilic polymers such as water-soluble gelatin, starch, dextrins, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer, polyvinylmethyl ether maleic anhydride copolymer, etc. Moreover, a vinyl polymer aqueous dispersion (latex) may also be added to gelatin layer.

Amount of polymeric binder in undercoat layer is generally 0.5–10 g/m$^2$, preferably 1–6 g/m$^2$. The undercoat layer may contain pigments, dyes, carbon black, etc. for antihalation purpose and furthermore, solid powders of 2–10 microns in average particle size for improvement of printing endurance. Furthermore, the undercoat layer may contain photographic additives such as developing agent, etc.

The undercoat layer may be such that disclosed in Japanese Patent Unexamined Publication Nos. 5503/73, 100203/73 and 16507/74.

The silver halide emulsion layer comprises, for example, silver chloride, silver bromide, silver chlorobromide and these silver halides further containing silver iodide. The silver halide grains may contain heavy metals such as rhodium salts, iridium salts, palladium salts, ruthenium salts, copper salts, etc. The crystals may be in any forms and may be monodisperse or polydisperse grains and furthermore, may be a core-shell type crystal or plate-like grains. One preferred example is to use monodisperse or polydisperse grains comprising at least 80% of silver chloride which contains a rhodium salt or iridium salt or combination thereof.

The silver halide can be sensitized in various ways during its preparation or coating. It may be chemically sensitized by the methods well known to the art by using, for example, sodium thiosulfate, alkylthioureas, or gold compounds such as gold rhodanide and gold chloride or mixtures thereof.

Silver halide may also be sensitized or desensitized positively or negatively with, for example, organic sensitizing dyes such as cyanine dyes and hemicyanine dyes. There are no special limitations in wavelength regions to which the silver halide can be sensitized or desensitized. Therefore, the silver halide can be subjected to orthochromatic or panchromatic sensitization, sensitizations for various light sources such as heliumneon laser, argon laser, LED and semiconductor laser and furthermore to sensitization for UV and desensitization for visible light for handling under room light. The sensitized silver halide emulsion may be such that suitable for high-intensity short-time exposure.

The catalytic layer provided over the emulsion layer contains physical development nuclei. The physical development nuclei may be, for example, finely divided particles of metals such as silver, antimony, bismuth, cadmium, cobalt, lead, nickel, palladium, rhodium, gold, platinum, iron, etc. sulfides, polysulfides or selenides of these metals or mixtures or mixed crystals thereof The catalytic layer may or may not contain a hydrophilic binder. If it contains the binder, examples of the binder are hydrophilic high polymers such as gelatin, starch, dialdehyde starch, carboxymethyl cellulose, gum arabic, sodium alginate, hydroxyethyl cellulose, polystyrenesulfonic acid, vinylimidazoleacrylamide copolymer, polyvinyl alcohol, etc. or oligomers thereof.

The catalytic layer may further contain developing agents such as hydroquinone, methylhydroquinone, catechol or the like and known hardeners such as formalin, succinaldehyde, etc.

Each of the layers such as undercoat layer, silver halide emulsion layer, catalytic layer, etc. may contain some of anionic, cationic and neutral surface active agents as coating aids and may further contain thickening agent and antistatic agent.

As the supports for the lithographic printing plate materials of this invention, there may be used any of those which can stand printing such as papers, synthetic or semisynthetic polymer film, metallic plates of aluminum, iron, etc. The support may be coated on one or both sides with one or more layers of polymeric films or metallic thin films. The surface of these supports can be surface-treated so as to improve adhesion to coating layers.

Especially preferred supports are papers coated with a polyolefin polymer on one or both sides, polyester films, polyester films subjected to hydrophilizing treatment on the surface, surface treated aluminum plates, etc.

These supports may contain an antihalation dye or solid fine particles for improvement of surface properties. The supports may be light transmissible for carrying out back side exposure.

The diffusion transfer processing solutions used in this invention may contain alkaline substances such as, for example, sodium hydroxide, potassium hydroxide, lithium hydroxide, and trisodium phosphate; preservatives such as sulfites; silver halide solvents such as thiosulfates, thiocyanates, cyclic imides, 2-mercaptobenzoic acid and amines; thickening agents such as hydroxyethyl cellulose and carboxymethyl cellulose; antifoggants such as potassium bromide and compounds described in Japanese Patent Unexamined Publication No. 26201/72; developing agents such as hydroquinones, catechol and 1-phenyl-3-pyrazolidone; development modifiers such as polyoxyalkylene compounds and onium compounds.

As the processing solution, a second solution may additionally be used which contains compounds which neutralize the alkalinity and further improve ink-receptivity of the surface silver layer.

The surface silver layer formed after development on the lithographic printing plate material of this invention may be rendered ink receptive or enhanced in ink receptivity by use of any known surface treating agents. These are such as, for example, those described in Japanese Patent Examined Publication No. 29723/73 and U.S. Pat. No. 3,721,559.

Printing method, etch (desensitizing) solution, damping solution, etc. may be as those known well.

The invention is illustrated below with reference to Examples, but the invention is not limited thereto.

EXAMPLE 1

On one side of a both-side polyethylene coated paper of 135 g/m$^2$ was provided a matting layer containing silica powder of 5 $\mu$ in average particle size. On another side which had been subjected to corona discharge treatment were simultaneously coated two layers, namely, an undercoat layer (containing 3.5 g/m$^2$ of gelatin) containing silica powder of 7 $\mu$ in average particle size and an orthochromatically sensitized high sensitive silver chloride emulsion (containing 0.8 g/m$^2$ of gelatin) containing 0.1 g/m$^2$ of 1-phenyl-3-pyrazolidone at a coverage of 1.0 g/m$^2$ in terms of silver nitrate on said undercoat layer. As hardeners, 170 mg/m$^2$ of 2,4-dichloro6-hydroxy-S-triazine sodium salt was added to the undercoat layer in-line with coating and 80 mg/m$^2$ of N-methylolethyleneurea was added to the emulsion layer. After drying, the emulsion layer was coated with a nuclei coating composition described in Example 2 of Japanese Patent Unexamined Publication No. 21602/78 (the polymer used was No. 3 acrylamide-imidazole copolymer and the developing agent hydroquinone was contained in an amount of 0.8 g/m$^2$) and this was dried to obtain a lithographic printing plate material which will be employed as comparative sample A.

Samples of this invention were prepared in the same manner as above, except that benzotriazole in an amount of 7-28 mg/m$^2$ was contained in the undercoat layer.

Thus obtained lithographic printing plate materials were subjected to imagewise exposure by a process camera having image reversing mechanism and then were developed with the following silver complex diffusion transfer developer at 30° C. for one minute.

| Transfer developer | |
|---|---|
| Water | 700 ml |
| Potassium hydroxide | 20 g |
| Anhydrous sodium sulfite | 50 g |
| 2-Mercaptobenzoic acid | 1.5 g |
| 2-Methylamino ethanol | 15 g |
| Water to make up one liter. | |

After development, each material was passed through a pair of squeeze rolls to remove the excess developer, then immediately treated at 25° C. for 20 seconds with a neutralizer of the following composition, again passed through the squeeze rolls to remove the excess liquid and dried at room temperature.

| Neutralizer | |
|---|---|
| Water | 600 ml |
| Citric acid | 10 g |
| Sodium citrate | 35 g |
| Colloidal silica (20% solution) | 5 ml |
| Ethylene glycol | 5 ml |
| Water to make up one liter. | |

Thus obtained lithographic printing plates were mounted on an offset printing machine, then applied with the following etch solution all over the plate surface and printing was run using the following damping solution.

| Etch solution | |
|---|---|
| Water | 600 ml |
| isopropyl alcohol | 400 ml |
| Ethylene glycol | 50 g |
| 3-Mercapto-4-acetamido-5-n-heptyl-1,2,4-triazole | 1 g |
| Damping solution | |
| o-Phosphoric acid | 10 g |
| Nickel nitrate | 5 g |
| Sodium sulfite | 5 g |
| Ethylene glycol | 100 g |
| Colloidal silica (20% solution) | 28 g |
| Water to make up 2 liters. | |

The printing machine employed was A.B Dick 350CD (Trade name for offset printing machine supplied by A.B. Dick Co.). The printing endurance was evaluated in terms of the number of copies delivered before the printing had become impossible owing to the occurrence of scumming and disappearance of image due to wearing-off of silver image and expressed in marks rated in accordance with the following criteria.

| "⊚" | 20,000 copies or more |
|---|---|
| "◎" | 10,000–20,000 copies |
| "Δ" | 5,000–10,000 copies |
| "x" | 2,000–5,000 copies |

The results are shown in Table1.

EXAMPLE 2

The procedure of Example 1 for production of comparative sample A was repeated except that 30 mg/m$^2$ of thiobenzoic acid was contained in the emulsion layer and 210 mg/m$^2$ of formalin was used in place of 2,4-dichloro-6-hydroxy-S-triazine sodium salt as a hardener. Thus obtained lithographic printing plate material was employed as comparative sample B.

Samples of this invention were produced in the same manner as production of sample B mentioned above except that 5-methylbenzotriazole was added in an amount of 4–16 mg/m$^2$ to the undercoat layer. Then, in the same manner as in Example 1, lithographic printing plates were made and evaluation was effected. The results are shown in Table 2.

EXAMPLE 3

The procedure of Example 2 for production of sample B was repeated except that silver chloride emulsion containing an iridium salt and sensitized for exposure to helium-neon laser beam was used. Thus obtained lithographic printing plate material was comparative sample C.

Samples of this invention were prepared in the same manner as production of sample C except that 5-chlorobenzotriazole was added in an amount of 7–28 mg/m$^2$ to the undercoat layer.

Lithographic printing plates were made from these materials in the same manner as in Example 1 except that exposure was carried out by a flat-bed scanning type setter using helium-neon laser of Linotype Linotronic 300 and evaluation was carried out also according to the procedure of Example 1. The results are shown in Table 3.

EXAMPLE 4 1

Lithographic printing plates of this invention were made in the same manner as in Example 1, except that benzotriazole in an amount of 7–28 mg/m$^2$ was added to the catalytic layer and not to the undercoat layer and evaluation of the plates was carried out also according to the procedure of Example 1. The results are shown in Table 4.

TABLE 1

| | Results of printing | | |
|---|---|---|---|
| Printing plate | Content of BT | Disappearance of image | Scumming |
| Comparative sample A | 0 mg/m$^2$ | x | ⊚ |
| This invention | 7 mg/m$^2$ | Δ | ⊚ |
| This invention | 14 mg/m$^2$ | O | ⊚ |
| This invention | 28 mg/m$^2$ | Δ | ⊚ |

"BT" means benzotriazole.

TABLE 2

| | Results of printing | | |
|---|---|---|---|
| Printing plate | Content of MBT | Disappearance of image | Scumming |
| Comparative sample B | 0 mg/m$^2$ | Δ | ◎ |
| This invention | 4 mg/m$^2$ | O | ⊚ |
| This invention | 8 mg/m$^2$ | ⊚ | ⊚ |
| This invention | 16 mg/m$^2$ | O | ⊚ |

"MBT" means 5-methylbenzotrisazole

TABLE 3

| Printing plate | Content of CBT | Results of printing Disappearance of image | Scumming |
|---|---|---|---|
| Comparative sample C | 0 mg/m² | x | ◎ |
| This invention | 7 mg/m² | Δ | ◎ |
| This invention | 14 mg/m² | ○ | ◎ |
| This invention | 28 mg/m² | Δ | ◎ |

"CBT" means 5-chlorobenzotriazole

TABLE 4

| Printing plate | Content of BT | Results of printing Disappearance of image | Scumming |
|---|---|---|---|
| This invention | 7 mg/m² | Δ | ◎ |
| This invention | 14 mg/m² | ○ | ◎ |
| This invention | 28 mg/m² | Δ | ◎ |

"BT" means benzotriazole. Comparative sample in this Table is comparative sample A in Table 1.

What is claimed is:

1. A lithographic printing plate material having improved printing andurance which utilizes the silver complex diffusion transfer process for making the plate and which comprises a support and at least an undercoat layer, a silver halide emulsion layer and a catalytic layer containing physical development nuclei provided in this order on said support, at least one of these layer containing at least one of nonpolymerized benzotriazoles and its substitution derivatives represented by the following general formula [I]:

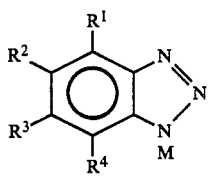

wherein M represents hydrogen, an alkali metal or ammonium ion and R¹-R⁴ each represents hydrogen atom, alkyl group, alkenyl group, aralkyl group, aryl group, halogen atom, alkoxy group, hydroxyl group, amino group, carboxyl group, sulfone group, alkoxycarbonyl group, acylamide group or sulfonamide group and two of R¹-R⁴ may link to form a ring.

2. A lithographic printing plate material according to claim 1 wherein the benzotriazole or its derivative is contained in a layer other than the emulsion layer.

3. A lithographic printing plate material according to claim 2 wherein the benzotriazole or its derivative is contained in the undercoat layer.

4. A lithographic printing plate material according to claim 1 wherein amount of the benzotriazole or its derivative is 1-200 mg/m².

5. A lithographic printing plate material according to claim 1 wherein the benzotriazole derivative is selected from the following group:

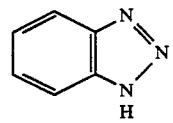
1

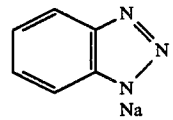
2

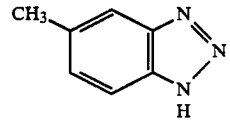
3

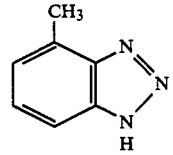
4

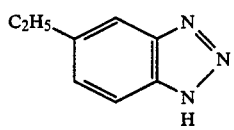
5

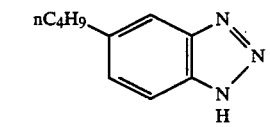
6

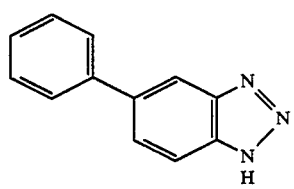
7

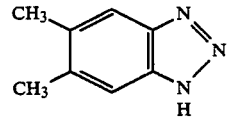
8

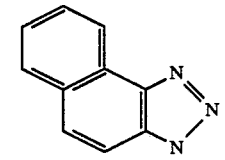
9

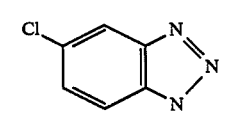
10

-continued

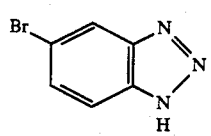 11

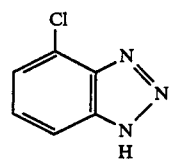 12

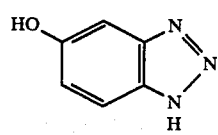 13

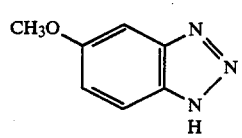 14

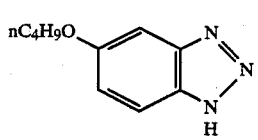 15

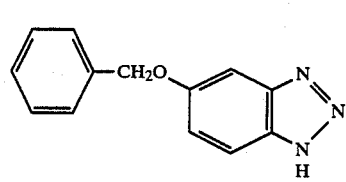 16

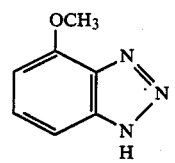 17

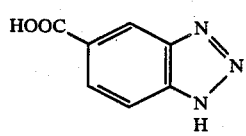 18

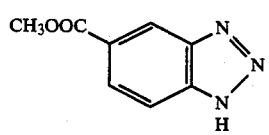 19

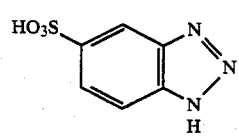 20

-continued

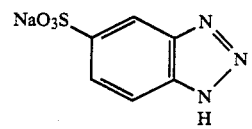 21

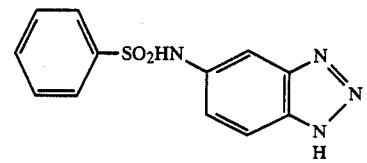 22

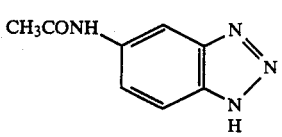 23

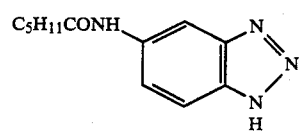 24

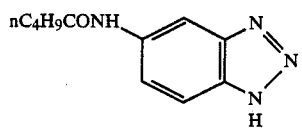 25

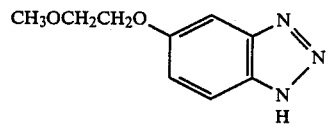 26

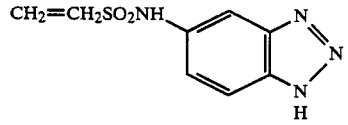 27

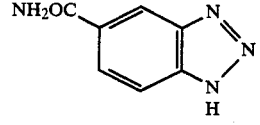 28

29

30

6. A process for making a lithographic printing plate which comprises subjecting the lithographic printing plate material of claim 1 to imagewise exposure and then diffusion transfer development.

7. A printing method which comprises applying a printing ink to the silver image formed on the surface layer of the lithographic printing plate obtained according to claim 6.

* * * * *